United States Patent [19]
Kim

[11] Patent Number: 6,087,890
[45] Date of Patent: Jul. 11, 2000

[54] REDUNDANCY FUSE READ CIRCUIT

[75] Inventor: Dae-Han Kim, Choongcheongbuk-Do, Rep. of Korea

[73] Assignee: LG Semicon Co., Ltd., Chungcheongbuk-Do, Rep. of Korea

[21] Appl. No.: 09/197,468

[22] Filed: Nov. 23, 1998

[30] Foreign Application Priority Data

Apr. 14, 1998 [KR] Rep. of Korea ........................ 98-13254

[51] Int. Cl.[7] ................................................. H03K 19/003
[52] U.S. Cl. ............................................. 327/526; 327/143
[58] Field of Search ..................................... 327/142, 143, 327/198, 525, 526; 365/96, 225.7

[56] References Cited

U.S. PATENT DOCUMENTS

| | | | |
|---|---|---|---|
| 5,177,375 | 1/1993 | Ogawa et al. | 327/143 |
| 5,300,840 | 4/1994 | Drouot | 327/526 |
| 5,619,469 | 4/1997 | Joo | 365/225.7 |
| 5,703,510 | 12/1997 | Iketani et al. | 327/143 |
| 5,825,698 | 10/1998 | Kim et al. | 365/200 |

*Primary Examiner*—Tuan T. Lam
*Attorney, Agent, or Firm*—Morgan, Lewis & Bockius LLP

[57] ABSTRACT

A redundancy fuse read circuit includes an external source voltage detector for detecting a voltage level of an external source voltage and generating a HIGH enable detection signal, a fuse information storage unit for generating fuse information by capacitive coupling in accordance with the HIGH enable detection signal and for sensing the fuse information, and a comparator for comparing an output signal of the fuse information storage unit and one of an internal and external address signals.

8 Claims, 8 Drawing Sheets

REDUNDANCY FUSE READ CIRCUIT

This application claims the benefit of Korean Patent Application No. 13254/1998, filed Apr. 14, 1998, which is hereby incorporated by reference.

BACKGROUND OF THE INVENTION

1. Field of the Invention

The present invention relates to a redundancy fuse read circuit for a semiconductor memory device, and more particularly, to an improved redundancy fuse read circuit that decreases chip size, power consumption and stress on the fuse without affecting its response time.

2. Discussion of the Related Art

As shown in FIG. 1, a redundancy fuse read circuit according to a first example of the related art includes an external voltage source detector 1, a gate control unit 2, a fuse FS10, a PMOS transistor PM11, an NMOS transistor NM11, and a latch 3.

The external voltage source detector 1 receives an external source voltage Vcc and a ground voltage Vss, and outputs a power up signal PWRUP. The gate control unit 2 receives the power up signal PWRUP, and outputs control signals FENB, FPR. The fuse FS10 has one terminal connected to source voltage Vcc. The PMOS transistor PM11 has its gate connected to a first control signal FENB and its source connected to another terminal of the fuse FS10. The NMOS transistor NM11 has its gate connected to a second control signal FPR, its drain connected to the drain of the PMOS transistor PM11, and its source connected to the ground voltage Vss. The latch 3 has its input terminal connected to a node N10, which is coupled in common to the drain of the PMOS transistor PM11 and the drain of the NMOS transistor, so as to latch the voltage at the node N10.

The latch 3 includes an inverter INV10 for inverting the voltage of the node N10 to output an output signal OUT; a PMOS transistor PM12 that has its source connected to the external source voltage Vcc, its gate connected to an output of the inverter INV10, and its drain connected to the node N10; and an NMOS transistor NM12 that has its drain connected to the node N10, its source connected to the ground voltage Vss, and its gate connected to the output OUT of the inverter INV10.

The operation of the redundancy fuse read circuit according to the first example of the related art will now be described.

First, when the external supply voltage Vcc transitions from LOW to HIGH, the external source voltage detector 1 generates the power up signal PWRUP, which is enabled at LOW. In the gate control unit 2, the control signals FENB, FPR are generated in accordance with the input of the power up signal PWRUP.

Here, the first control signal FENB denotes a signal enabled at LOW. When the power up signal PWRUP is disabled, it is switched to HIGH for turning off the PMOS transistor PM11. When the power up signal PWRUP is enabled, the first control signal FENB is enabled at LOW to turn on the PMOS transistor PM11.

The second control signal FPR is a signal that is enabled at a LOW, and when the power up signal PWRUP is disabled, it is turned to HIGH to thereby turn on the NMOS transistor NM11, so that the node N10 becomes reset to LOW. Also, when the power up signal PWRUP is enabled, the second control signal FPR is enabled to turn off the NMOS transistor NM11.

Therefore, when the fuse FS10 is open, the node N10, which is an output of a programmable fuse ROM, including the PMOS transistor PM11 and the NMOS transistor NM11 that are connected in series between the external source voltage Vcc and ground voltage Vss, is at LOW. When the fuse FS10 is closed, the node N10 is at HIGH. At this time, the latch 3 receives the voltage at the node N10 to be latched. Although the first control signal FENB is disabled to HIGH, the voltage at the node N10 is still stored in a memory.

As shown in FIG. 2, the redundancy fuse read circuit according to a second example of the related art includes a capacitor C20 having one terminal connected to the external source voltage Vdd and another terminal connected to a node N20, a fuse FS20 having one terminal connected to the node N20 and another terminal connected to the ground voltage Vss, a resistor R20 having one terminal connected to the external source voltage Vdd and another terminal connected to the node N20, a first PMOS transistor PM21 having a source connected to the external source voltage Vdd and a drain connected to the node N20, and a second PMOS transistor PM22 and an NMOS transistor NM20 connected in series between the external source voltage Vdd and the ground voltage Vss with their gates connected in common to the node N20 to output an output signal OUT, and having their drains connected in common to the gate of the first PMOS transistor PM21.

The operation of the redundancy fuse read circuit according to the second example of the related art will now be explained.

The fuse FS20 connected in series with the resistor R20 between the external source voltage Vdd and the ground voltage Vss is part of a main voltage branch which includes a fuse ROM. When the fuse FS20 is open, the voltage at the node N20 is at HIGH, and when the fuse FS20 is closed, the voltage at the node N20 is at LOW.

The inverter INV includes the second PMOS transistor PM22 and the NMOS transistor NM20, which are connected in series between the external source voltage Vdd and the ground voltage Vss. The latch LAT includes the inverter INV and a feedback circuit having the first PMOS transistor PM21, so that the inverter INV and the latch LAT can latch the voltage at the node N20.

Here, the capacitor C20 between the external source voltage Vdd and the node N20 sets a logic state of the node N20 using a capacitive coupling, when the external voltage Vdd changes abruptly.

As illustrated in FIG. 3, the redundancy fuse read circuit according to a third example of the related art includes an NMOS transistor NM30 and a floating gate transistor FGT, which are connected in series between the external source voltage Vdd and the ground voltage Vss, with their gates connected to a control signal PW and a predetermined voltage VL, respectively; a first inverter INV31 having its input terminal connected to the node N30 (which is connected in common to drains of the NMOS transistor NM30 and the floating gate transistor FGT); a PMOS transistor PM30 having its source connected to the external source voltage Vdd, its drain connected to the node N30 and its gate connected to the output of the first inverter INV31; a second inverter INV32 having an input connected to the output of the first inverter INV31; and an exclusive OR gate XOR30 having one input terminal connected to an output of the second inverter INV32 and another input terminal connected to an external address ADD.

The operation of the redundancy fuse read circuit according to the third example of the related art will now be explained.

The NMOS transistor NM30 and the floating gate transistor FGT, which functions as a fuse, are connected in series between the external supply voltage Vdd and the ground voltage Vss. A control signal PW is applied to the gate of the NMOS transistor NM30. A voltage VL is applied to the control gate of the floating gate transistor FGT to form a main branch of a fuse ROM 31.

The floating gate transistor FGT as a fuse has a high threshold voltage Vth when programmed, and a low threshold voltage when unprogrammed, so that an open or closed characteristic is obtained when the voltage VL is applied to the control gate of the floating gate transistor FGT. Therefore, the node N30 is HIGH or LOW depending on the voltage VL and on whether the floating gate transistor FGT is programmed or unprogrammed. Then, a voltage at the node N30 is latched in the latch 32, where a feedback loop is formed by the first inverter INV31 and the PMOS transistor PM30.

Meanwhile, when the external source voltage Vdd transitions and is set to a predetermined voltage, the control signal PW applied to the gate of the NMOS transistor NM30 of the fuse ROM 31 maintains HIGH during a short pulse, then the NMOS transistor NM30 is temporarily turned on to set the node N30 to HIGH. The HIGH signal at the node N30 is latched in a latch 32. Hence, even if the control signal PW is disabled, the HIGH at the node N30 is stored.

As shown in FIG. 4, the redundancy fuse read circuit according to a fourth example of the related art includes an NMOS transistor NM41 for applying a raised voltage Vpp to a fuse drain line; an NMOS transistor NM42 for applying an external source voltage Vcc to a redundancy row line; and fuse cells 41, 42 including an EEPROM (Electrically Erasable Programmable Read Only Memory) connected to the redundancy row line, the fuse drain line and the fuse gate line and receiving an external address signal ADD and inverted address signal /ADD for comparison.

The first fuse cell 41 includes NMOS transistors NM43, NM44, NM45 with their gates connected to the address signal ADD, and their drains connected to the fuse gate line, the redundancy row line, and the fuse drain line, respectively. The first fuse cell 41 also includes floating gate transistors FGT41, FGT42 with drains connected to the respective sources of the NMOS transistors NM44, NM45, and their sources connected to the ground voltage Vss. The second fuse cell 42 is identical to the first fuse cell 41 in structure although the inverted address signal/ADD, instead of the external address signal ADD, is applied to the second fuse cell 42.

The operation of the redundancy fuse read circuit according to the fourth example of the related art will now be explained.

The fourth example according to the related art employs an address matching in which the external address signal ADD and the inverted address signal /ADD are applied to the fuse cells 41, 42, respectively.

The floating gate transistors FGT41, FGT42 of the first fuse EEPROM cell and the second fuse EEPROM cell are connected in common, so that the raised voltage Vpp is applied to the fuse drain line. Through a program path passing from the fuse drain line through the NMOS transistor NM45 to the second floating gate transistor FGT42, the floating gate transistor FGT42 of the second fuse EEPROM cell is programmed to raise the threshold voltage Vth of the floating gate transistor FGT42, thereby raising the threshold voltage Vth of the first floating gate transistor FGT41 as well.

When the fuse information is read, the external source voltage Vcc is applied to the redundancy row line by the NMOS transistor NM42, and the read path goes from the redundancy row line to the NMOS transistor NM44 and from the NMOS transistor NM44 to the first fuse FGT41. At this time, the NMOS transistor NM43 allows a predetermined voltage to be applied to the fuse gate line to determine whether the floating gate transistors FGT41, FGT42 of the fuse EEPROM cell are turned on or off. Also, it is determined whether to pass or protect the predetermined voltage at the fuse gate line in accordance with the logic level of the address signal ADD by the floating gate transistors FGT41, FGT42.

As shown in FIG. 5, the redundancy fuse read circuit according to a fifth example, of the related art includes a fuse FS50 having one terminal connected to an external source voltage Vcc and another terminal connected to a second node N52; a first NMOS transistor NM51 having its drain connected to a second node N52, its source connected to the source voltage Vss and its gate connected to the first node N51; a capacitor C50 having one terminal connected to an external source voltage Vcc and another terminal connected to the first node N51; a second NMOS transistor NM52 having its drain connected to the first node N51, its source connected to the ground voltage Vss, and its gate connected to the second node N52; and a PMOS transistor PM50 having its source connected to an external source voltage Vcc, its drain connected to the first node N51 and its gate connected to the second node N52.

The operation of the redundancy fuse read circuit according to the fifth example of the related art will now be described.

In accordance with the opening or closing of the fuse FS50, the external source voltage Vcc rises, and the information at the fuse FS50 is read while being set to a predetermined voltage. In other words, when the fuse FS50 is open and the external source voltage Vcc rises, the capacitor C50 and a load capacitor at the first node N51 are set to HIGH by capacitive coupling. At this time, the voltage at the first node N51 is applied to the gate of the NMOS transistor NM51 to turn it on, and the second node N52 is connected to the ground voltage Vss. Therefore, the voltage at the second node N52 is applied to the gate of the PMOS transistor PM50 to turn it on, and a positive feedback sets the first node N51 to the external source voltage Vcc to latch the fuse information.

The redundancy fuse read circuit according to the first example of the related art has the following disadvantages. First, since the area occupied by the gate control unit 2 generating the control signals FENB, FPR is quite large, the size of the redundancy fuse read circuit is large. Also, because the fuse information latched in the latch 3 may be incorrect in accordance with the length the LOW interval of the first control signal FENB, the fuse information may be dominated by the first control signal FENB.

In the second example of the related art redundancy fuse read circuit, when the fuse FS20 is closed, a direct current path of the external source voltage Vdd and the ground voltage Vss is formed, thereby increasing power consumption. Also, the capacitor C20 between the external source voltage Vdd and the node N20 is effective only when the external source voltage Vdd abruptly changes, thus decreasing noise immunity. However, when the source voltage rise time is long, a bias setting function of the node N20 is lost. This is because the charge collected at the node N20 by the capacitive coupling is released through a leakage path.

In the third example of the related art redundancy fuse read circuit, an increase in the external voltage Vdd causes the voltage VL and the control signal PW to be concurrently generated. Accordingly, the third example is dominated by the length of the HIGH interval of the control signal PW, as the length of the LOW interval of the control signal FENB dominated the first example. Also, when the fuse is closed, a direct current flows between the external source voltage Vdd and the ground voltage Vss during the HIGH interval of the control signal PW, thereby increasing power consumption.

In the fourth example of the related art redundancy fuse read circuit, whenever an address signal transitions in the first fuse cell 41 for receiving the address signal ADD and in the second fuse cell 42 for receiving the inverted address signal /ADD, one of the two is always enabled so that a redundancy row line is connected to the first fuse drain and the fuse gate line is connected to the control gate. Therefore, more stress is applied to the fuse read circuit than to a given cell of a main cell array in a memory, so that the write time of a memory chip depends more upon the redundancy fuse longevity than on the cell of the main cell array. Also, when an address is set and a certain voltage is applied to the control gate and drain of the first fuse of the fuse cell, if the fuse is closed, a direct current path is formed between the external source voltage Vcc and the ground voltage Vss, thereby increasing power consumption.

With regard to the fifth example of the related art redundancy fuse read circuit, the capacitor C50 is connected between the external source voltage Vcc and the first node N51. When, the external source voltage Vcc is powered on, the capacitive coupling provided by the capacitor C50 and the load capacitor of the first node N51 is employed to set an initial bias of the first node N51, and the information of the fuse FS50 is latched by a gate input of the NMOS transistor NM51. If the rise time of the external source voltage Vcc during power-on is not limited, the drain junction leakage current of the PMOS transistor PM50 at the first node N51, the drain junction leakage current of the NMOS transistor NM52 and the large leakage current of the NMOS transistor NM51 do not allow the node initial bias to be set, whereby incorrect fuse information may be transferred through the inverter INV50.

SUMMARY OF THE INVENTION

The present invention is directed to a redundancy fuse read circuit that substantially obviates one or more of the problems due to the limitations and disadvantages of the related art.

One object of the present invention is to provide a redundancy fuse read circuit without a direct current path, thereby decreasing a power consumption.

Another object of the present invention is to provide a redundancy fuse read circuit for eliminating an excessive domination of an active time interval of a predetermined signal generated when an external source voltage is powered on.

Another object of the present invention is to provide a redundancy fuse read circuit for decreasing the chip area needed for the fuse read circuit by eliminating a need for a control signal generation circuit without being controlled by a predetermined control signal.

Additional features and advantages of the present invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, in one aspect of the present invention there is provided a redundancy fuse read circuit including an external source voltage detector for detecting a voltage level of an external source voltage and generating a HIGH enable detection signal, a fuse information storage unit for generating fuse information by capacitive coupling in accordance with the HIGH enable detection signal and for sensing the fuse information, and a comparator for comparing an output signal of the fuse information storage unit and one of an internal address signal and an external address signal.

In another aspect of the present invention there is provided a redundancy fuse read circuit including an external source voltage detector for detecting a voltage level of an external source voltage and generating a HIGH enable detection signal, a fuse information unit for generating a capacitive coupling in accordance with the enable detection signal, and for latching and generating fuse information, and an inverter for inverting an output of the fuse information unit.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention that together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 6:
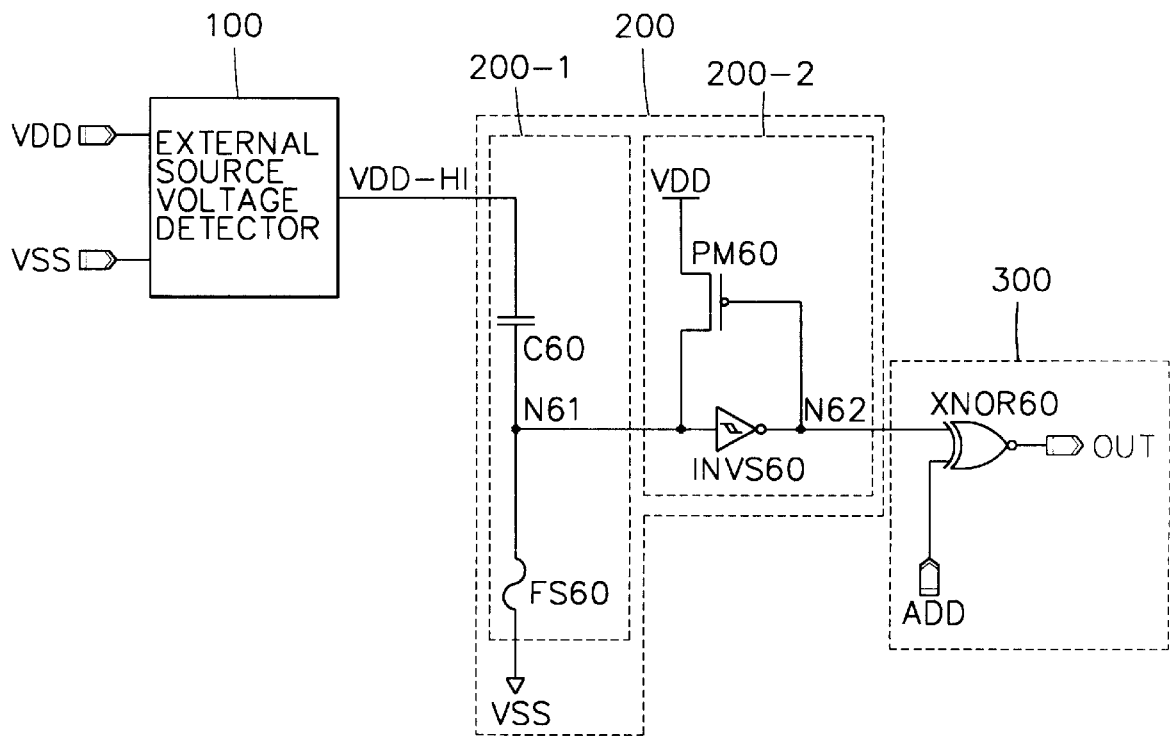
FIG. 6 is a block diagram illustrating a redundancy fuse read circuit according to a first embodiment of the present invention.

As shown in FIG. 6, the redundancy fuse read circuit according to the first embodiment of the present invention includes an external source voltage detector 100 for detecting a voltage level of the external source voltage Vdd and generating a HIGH enable detection signal Vdd-HI, a fuse information storage unit 200 having a capacitive coupling unit 200-1 for receiving the enable detection signal Vdd-HI and generating a fuse information by causing a capacitive coupling, a sensor 200-2 for sensing the fuse information, and a comparator 300 for receiving the fuse information at a first input terminal and an external or internal address signal ADD at a second input terminal for comparison.

The capacitive coupling unit 200-1 includes a capacitor C60 having one terminal connected to the detection signal Vdd-HI output from the external source voltage detector 100 and another terminal connected to the first node N61, and a fuse FS60 having one terminal connected to the ground voltage Vss and another terminal connected to the first node N61.

The sensor 200-2 includes a Schmitt trigger inverter INVS60 for receiving a signal at the first node N61, and a PMOS transistor PM60 having its source connected to the external source voltage Vdd, its drain connected to the voltage of the first node N61 and its gate connected to the output of the Schmitt trigger inverter INVS60.

The comparator 300 includes either an exclusive OR gate or an exclusive NOR gate. Here, the exclusive NOR gate XNOR60 is employed to receive the output of the Schmitt trigger inverter INVS60 at one input and the address signal ADD at another input.

The operation of the redundancy fuse read circuit according to the first embodiment of the present invention will now be described.

Figure 7A:
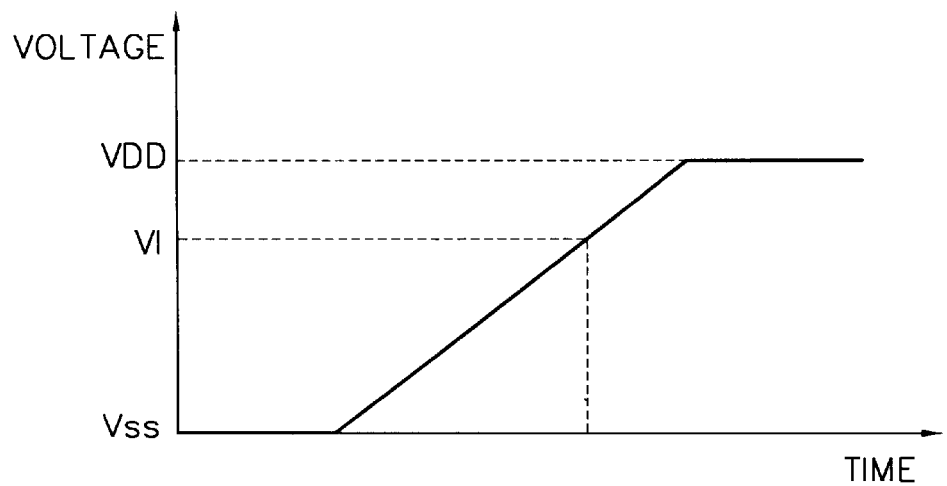
FIG. 7A is a timing diagram illustrating an input voltage in FIG. 6.
Figure 7B:
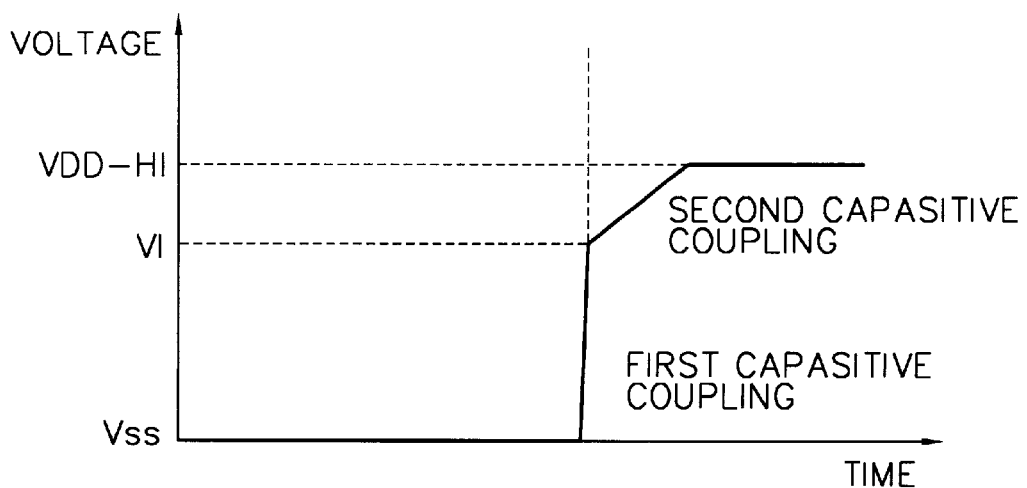
FIG. 7B is a timing diagram illustrating an internal voltage in FIG. 6.

As shown in FIG. 7A, when the external source voltage Vdd (typically about 3 V) is powered on and rising as time elapses, the detection signal Vdd-HI serving as an output of the external source voltage detector 100 is enabled to HIGH when the external source voltage Vdd reaches a predetermined voltage VI (typically about 2.3 V) as shown in FIG. 7B. Therefore, when the detection signal Vdd-HI is applied to one terminal of the capacitor C60, and the fuse FS60 is opened by the capacitive coupling between the capacitor C60 and the parasitic load capacitance of the first node N6 1, the voltage at the first node N61 is set HIGH.

The voltage at the first node N61 is applied to the Schmitt trigger inverter INVS60 and output to the second node N62. At this time, the PMOS transistor PM60 forms a positive feedback loop together with the Schmitt trigger inverter INVS60, so that the HIGH logic level at the first node N61 can be quickly sensed. Here, if the PMOS transistor PM60 were not employed, since the voltage set at the first node N61 is not charged from the external source voltage Vdd, the detection signal Vdd-HI, which has been enabled at HIGH, is discharged by a leakage path over a long period of time. Therefore, this circuit has two advantages in that the PMOS transistor PM60 is employed to form a positive feedback loop for quickly sensing the HIGH level at the first node N61, and to prevent the detection signal Vdd-HI from being discharged by the leakage path.

Figure 8:
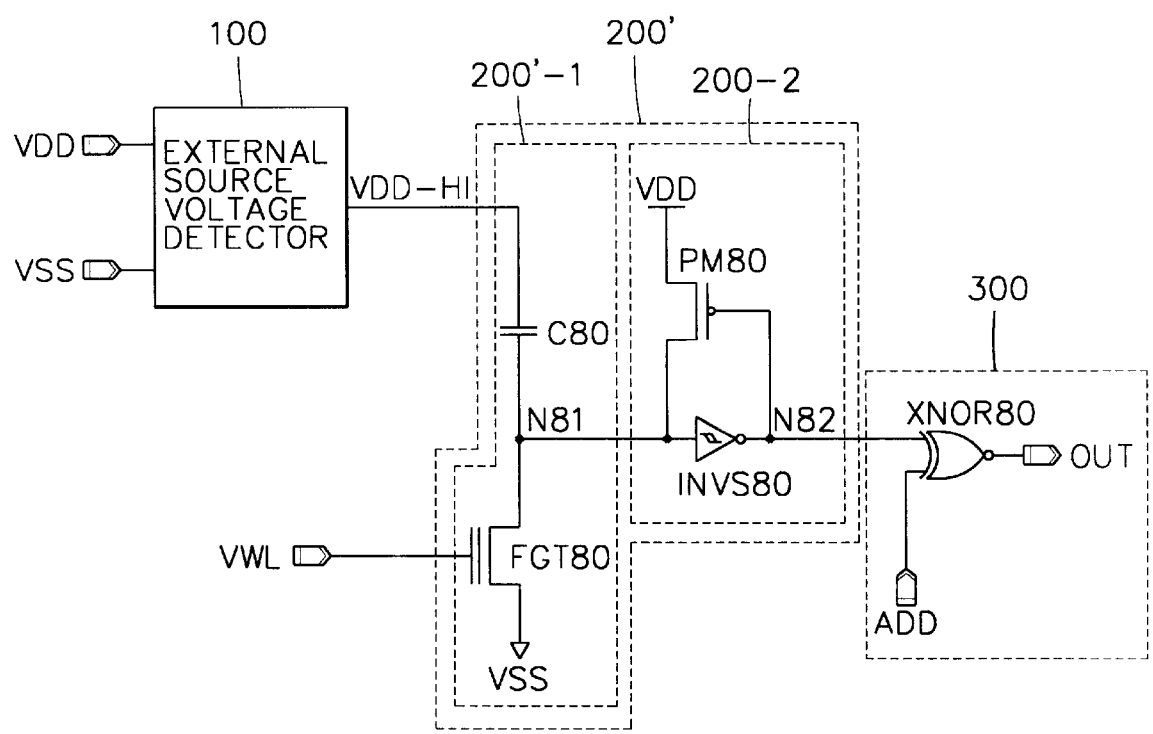
FIG. 8 is a block diagram illustrating a redundancy fuse read circuit according to a second embodiment of the present invention.

In the second embodiment of the present invention, the redundancy fuse read circuit includes an external source voltage detector 100, a fuse information storage unit 200' having a capacitive coupling unit 200'-1 and a sensor 200-2, and a comparator 300. Instead of the fuse FS60 of the capacitive coupling unit 200-1, there may be provided non-volatile memory cells such as an EPROM (Erasable Read Only Memory), EEPROM or UVPROM (Ultraviolet light Erasable Programmable Read Only Memory). The second embodiment of the present invention employs an EEPROM cell, as shown in FIG. 8, to form a new capacitive coupling unit 200'-1.

The operation of the redundancy fuse read circuit according to the second embodiment of the present invention is identical to that of the first embodiment and its description will be accordingly omitted.

The EEPROM cell fuse operation of the new capacitive coupling unit 200'-1 will now be described.

Figure 9A:
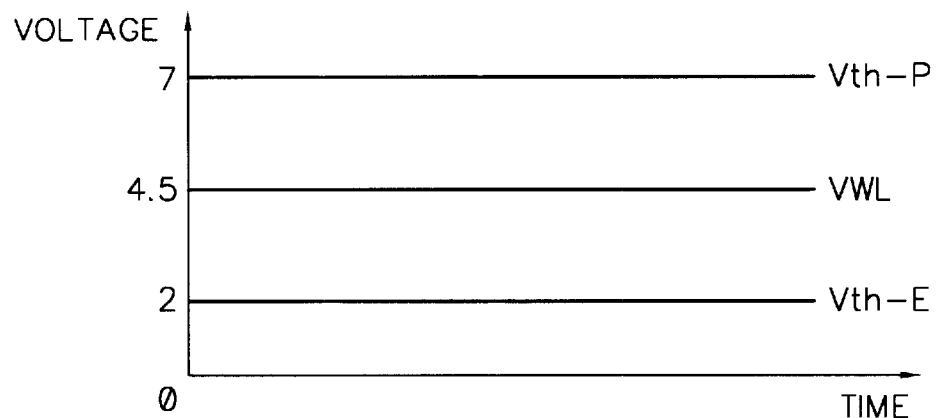
FIGS. 9A through 9C are timing diagrams comparing the input voltage and the internal voltage in FIG. 8.
Figure 9B:
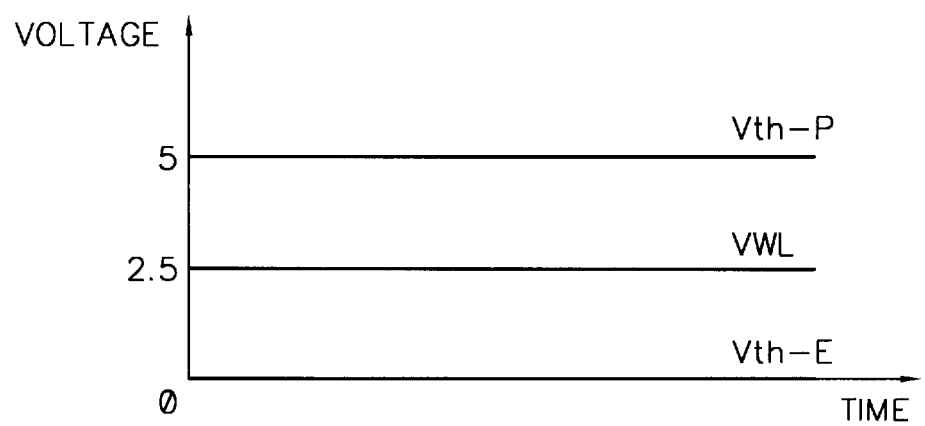
Figure 9C:
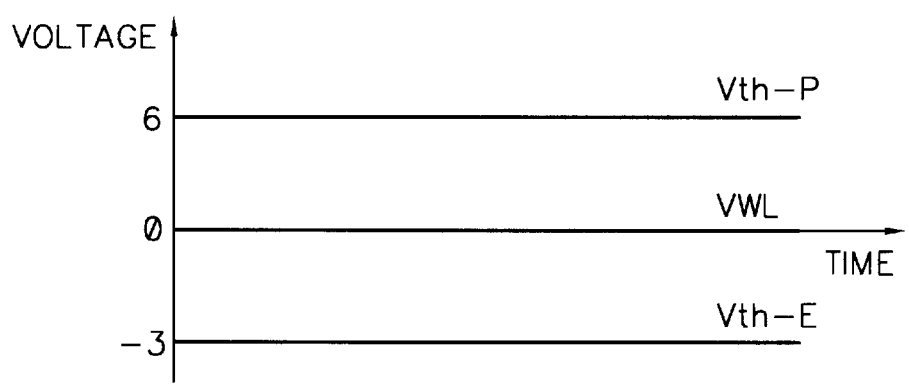

As shown in FIGS. 9A–9C, a voltage VWL, which is applied to a control gate of the EEPROM cell fuse in the new capacitive coupling unit 200'-1, may be set. In particular, a stress to which the control gate of the EEPROM cell fuse is subjected can be eliminated when the voltage VWL shown in FIG. 9C is applied.

Figure 10:
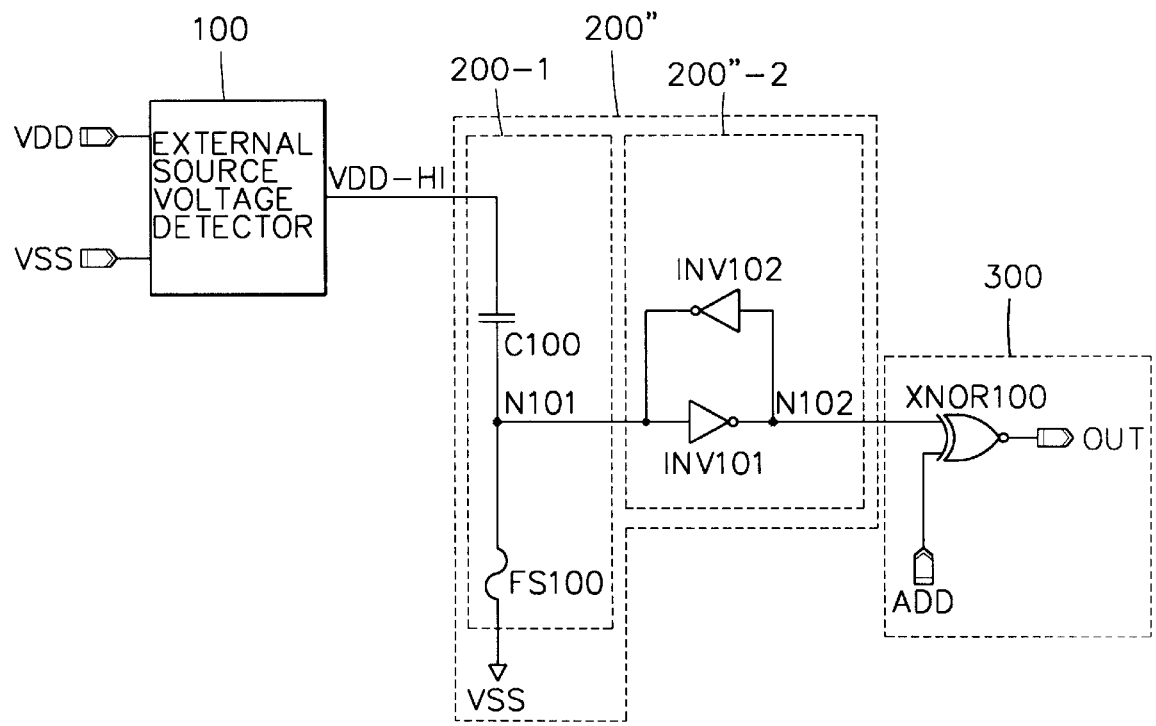
FIG. 10 is a block diagram illustrating a redundancy fuse read circuit according to a third embodiment of the present invention.
Figure 11:
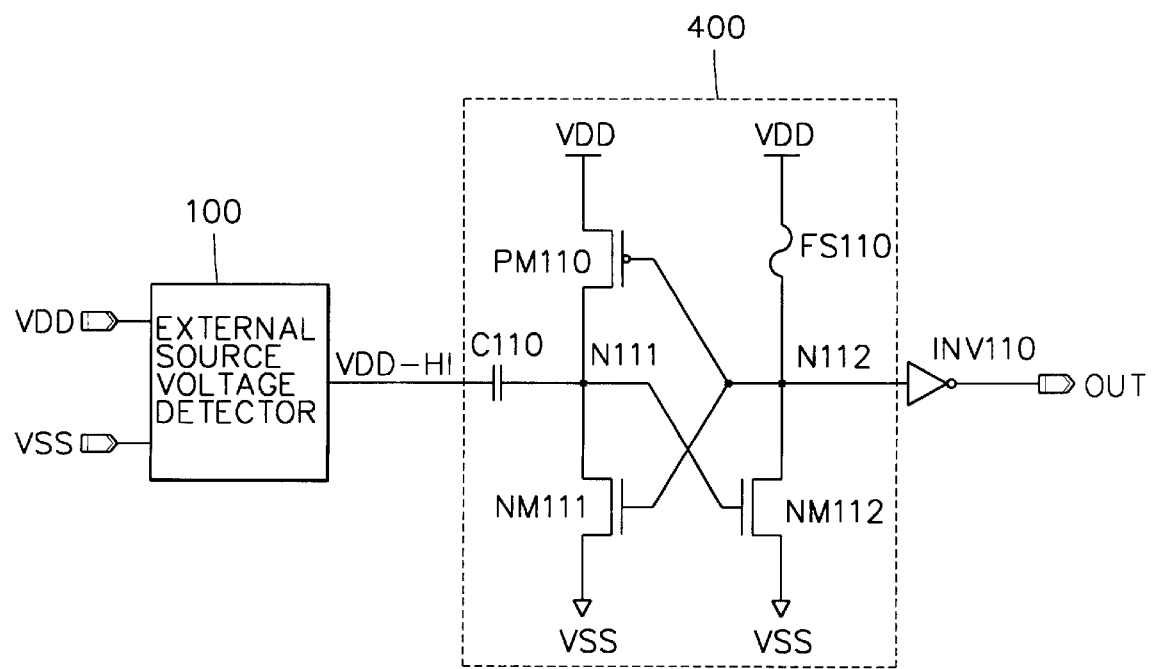
FIG. 11 is a block diagram illustrating a redundancy fuse read circuit according to a fourth embodiment of the present invention.

The redundancy fuse read circuit according to the third embodiment of the present invention, as in the first embodiment, includes an external source voltage detector 100, a fuse information storage unit 200" having the capacitive coupling unit 200-1 and the sensor 200"-2, and the comparator 300. As shown in FIG. 10, the third embodiment may also include a latch 200"-2 having two inverters INV101, INV102 instead of the Schmnitt trigger inverter INVS60, the PMOS transistor PM60 of the fuse information storage unit 200 and the sensor 200-2 of the first embodiment.

The operation of the third embodiment of the present invention is identical to that of the first embodiment, and accordingly its description will be omitted.

Figure 1:
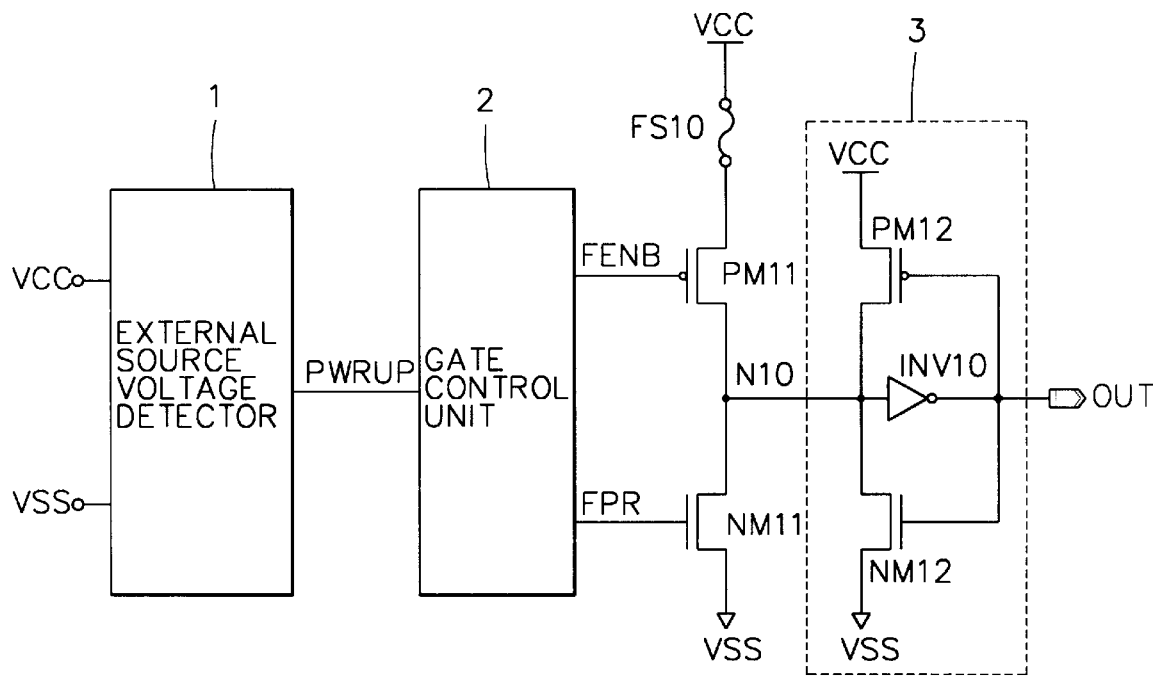
FIG. 1 is a block diagram illustrating a redundancy fuse read circuit according to a first example of the related art.
Figure 2:
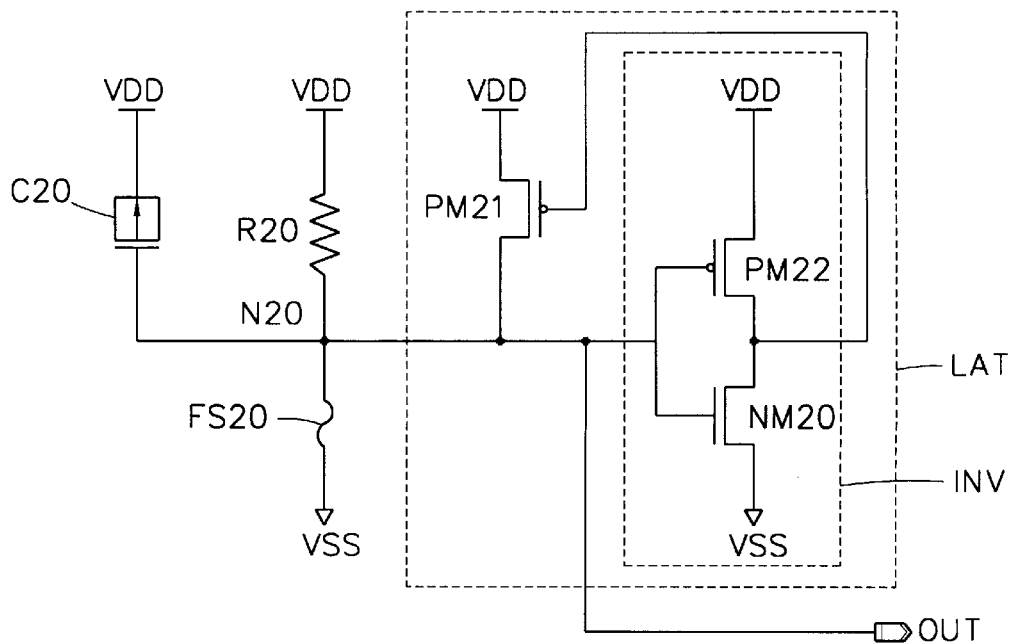
FIG. 2 is a block diagram illustrating a redundancy fuse read circuit according to a second example of the related art.
Figure 3:
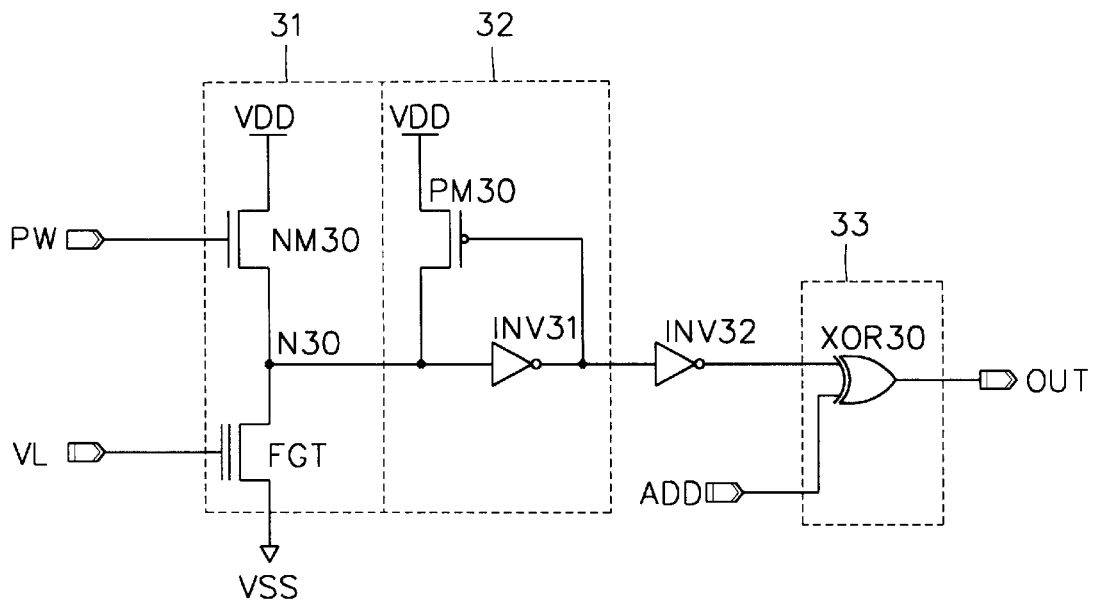
FIG. 3 is a block diagram illustrating a redundancy fuse read circuit according to a third example of the related art.
Figure 4:
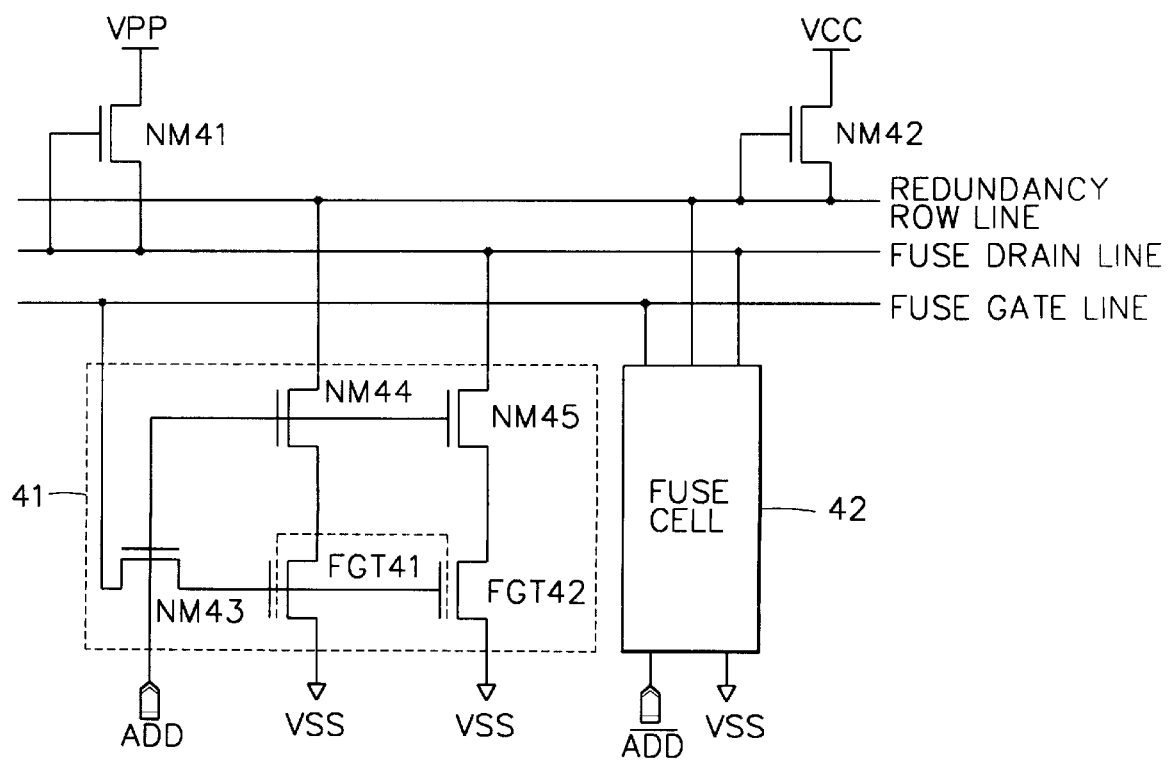
FIG. 4 is a block diagram illustrating a redundancy fuse read circuit according to a fourth example of the related art.
Figure 5:
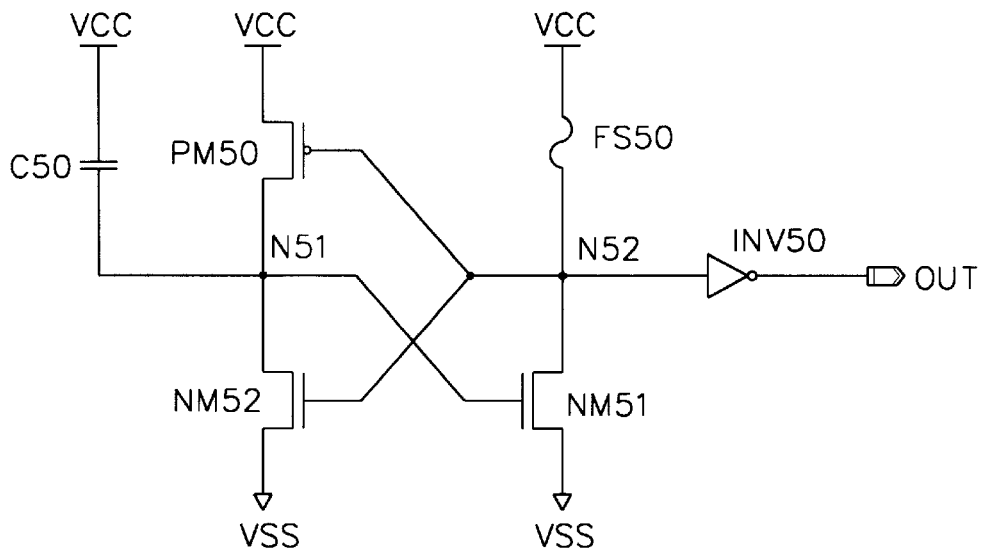
FIG. 5 is a block diagram illustrating a redundancy fuse read circuit according to a fifth example of the related art.

As shown in FIG. 1, the redundancy fuse read circuit according to a fourth embodiment of the present invention includes an external source voltage detector 100 for detecting a predetermined voltage level of the external source voltage Vdd and generating a HIGH enable detection signal Vdd-HI, a fuse information unit 400 and an inverter INV110 for inverting the voltage of a second node N112 serving as an output voltage of the fuse information unit 400 and outputting an output signal OUT.

The fuse information unit 400 includes a capacitor C110 having one terminal connected to the output VDD-HI of the external source voltage detector 100, and another terminal connected to a first node N111; a PMOS transistor PM10 having its source connected to an external source voltage Vdd, its drain connected to the first node N11, and its gate connected to the second node N112; a first NMOS transistor NM11 having its drain connected to the first node N111, its gate connected to the second node N112, and its source connected to the ground voltage Vss; a fuse FS110 having one terminal connected to the external source voltage Vdd and another terminal connected to the second node N112; and a second NMOS transistor NM112 having its drain connected to the second node N112, its gate connected to the first node N111, and its source connected to the ground voltage Vss.

The operation of the redundancy fuse read circuit according to the fourth embodiment of the present invention will now be described.

If the fuse FS110 is open, when the external source voltage Vdd is rising, the capacitive coupling provided by the capacitor C110 and the load capacitor at the second node N112 sets the first node N11 to HIGH. At this time, the voltage at the second node N112 is switched to HIGH to turn on the second NMOS transistor NM112, and the second node N112 is connected to the ground voltage Vss. Therefore, the voltage at the second node N112 is switched to LOW to turn on the PMOS transistor PM110 and set the first node N111 to the external source voltage Vdd as a positive feedback, latching the fuse information.

Therefore, in accordance with the opening or closing of the fuse FS 110, the information of the fuse FS110 is read while the external source voltage Vdd is rising to be set to the predetermined voltage level.

Figure 12:
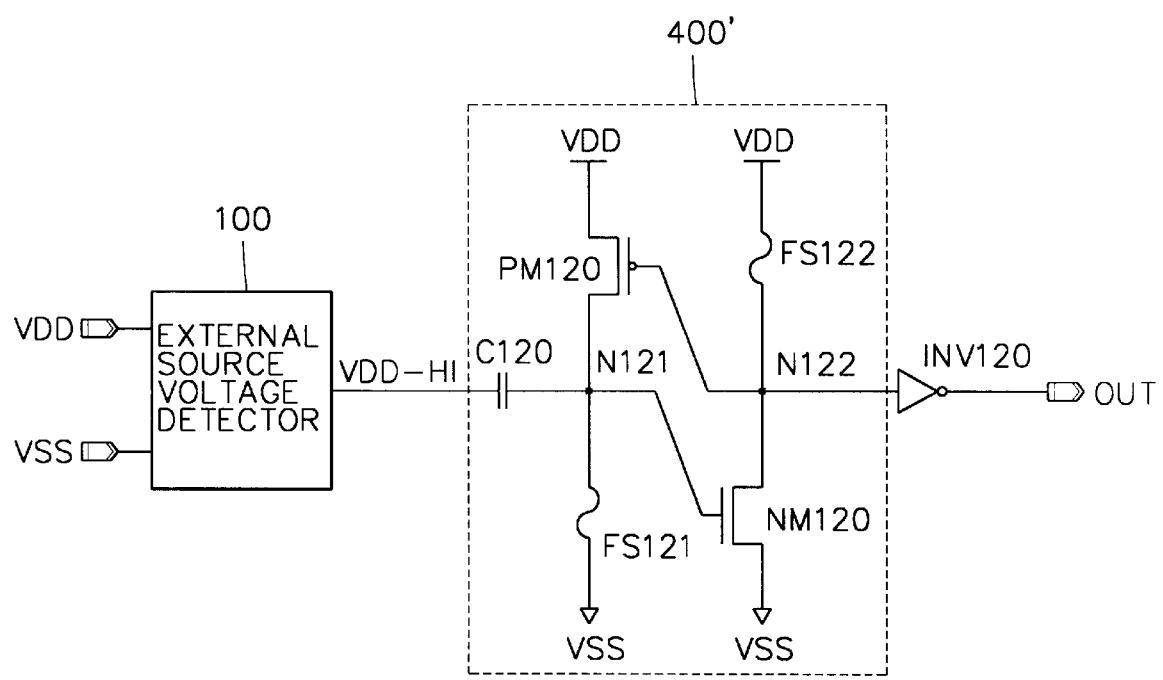
FIG. 12 is a block diagram illustrating a redundancy fuse read circuit according to a fifth embodiment of the present invention.

As shown in FIG. 12, the redundancy fuse read circuit according to a fifth embodiment of the present invention includes an external source voltage detector 100, a capacitor C120, a PMOS transistor PM120, a fuse FS122, a second NMOS transistor NM122 and an inverter INV120. Here, as shown in FIG. 12, instead of the first NMOS transistor NM111 in the fuse information unit 400 of the fourth embodiment of the present invention, the first fuse FS121 is employed.

The operation of the fifth embodiment of the present invention is identical to that of the fourth embodiment, and accordingly its description will be omitted.

As described above, the present invention allows for a decrease in chip area since an additional control circuit for regenerating a power-on control signal is not required.

Also, when determining a capacitor capacitance with regard to a parasitic load capacitance of a node according to a coupling rate to cause a capacitive coupling, a very small parasitic capacitance at the node causes the capacitor capacitance according to the coupling rate to be small. Hence, normal operation is achieved while requiring a small chip area. In other words, a capacitor coupling rate enables operation at a low voltage and low power.

In addition, because there is only transition current (with the exception of a direct current that is consumed within the external source voltage detector), power consumption is minimized.

When a HIGH enable signal (as a detection signal) is powered on in the external source voltage detector, a one-time enable is sufficient, eliminating an undesirable time delay.

Further, the present invention reads fuse information only during a power-on, and external or internal address signals are compared in a state of being latched, so that a stress associated with the fuse decreases when the address signals transition.

While the invention has been described in detail and with reference to specific embodiments thereof, it will be apparent to one skilled in the art that various changes and modifications can be made therein without departing from the spirit and scope thereof Thus, it is intended that the present invention cover the modifications and variations of this invention provided they come within the scope of the appended claims and their equivalents.

What is claimed is:

1. A redundancy fuse read circuit comprising:
   an external source voltage detector for detecting a voltage level of an external source voltage and generating a HIGH enable detection signal;
   a fuse information storage unit for generating fuse information in accordance with the HIGH enable detection signal and for latching the fuse information; and
   a comparator for comparing the fuse information and one of an internal address signal and an external address signal.

2. The circuit of claim 1, wherein the fuse information storage unit includes:
   a capacitive coupling unit including a capacitor and a fuse connected to each other in series between the HIGH enable detection signal and a ground voltage; and
   a sensor forming a feedback loop, the sensor including:
      a Schmitt trigger inverter for receiving a voltage at a node between the capacitor and the fuse; and
      a PMOS transistor having a source connected to the external source voltage, a drain connected to the node and a gate connected to an output terminal of the inverter.

3. The circuit of claim 1, wherein the fuse information storage unit includes:
   a capacitive coupling unit including a capacitor and at least one non-volatile memory cell connected to each other in series between the HIGH enable detection signal and a ground voltage; and
   a sensor forming a feedback loop, the sensor including:
      a Schmitt trigger inverter for receiving a voltage at a node between the capacitor and the at least one non-volatile memory cell; and
      a PMOS transistor having a source connected to the external source voltage, a drain connected to the node, and a gate connected to an output terminal of the inverter.

4. The circuit of claim 1, wherein the fuse information storage unit includes:
   a capacitive coupling unit including a capacitor and a fuse connected to each other in series between the HIGH enable detection signal and a ground voltage; and
   a sensor including a first inverter receiving a voltage at a node between the capacitor and the fuse, and a second inverter receiving an output of the first inverter and an output connected to an input of the first inverter.

5. The circuit of claim 1, wherein the comparator includes a two-input exclusive NOR gate for receiving the fuse information at one input and the external address signal at another input.

6. The circuit of claim 1, wherein the comparator includes a two-input exclusive OR gate for receiving the fuse information at one input and the external address signal at another input.

7. A redundancy fuse read circuit comprising:
   an external source voltage detector for detecting a voltage level of an external source voltage and generating a HIGH enable detection signal;
   a fuse information unit for generating fuse information in accordance with the HIGH enable detection signal, and for latching the fuse information; and
   an inverter for inverting an output of the fuse information unit,
   wherein the fuse information unit includes:
      a PMOS transistor and a first NMOS transistor connected to each other in series between the HIGH enable detection signal and a ground voltage and having gates connected together and to a second node;
      a capacitor having a first terminal connected to the HIGH enable detection signal and a second terminal connected to a first node between drains of the PMOS transistor and the first NMOS transistor;

a fuse connected between the external source voltage and the second node; and a second NMOS transistor having a gate connected to the first node, a drain connected to the second node and a source connected to the ground voltage, wherein an output signal is output from the second node.

8. A redundancy fuse read circuit comprising:

an external source voltage detector for detecting a voltage level of an external source voltage and generating a HIGH enable detection signal;

a fuse information unit for generating fuse information in accordance with the HIGH enable detection signal and for latching the fuse information; and an inverter for inverting an output of the fuse information unit, wherein the fuse information unit includes:

a PMOS transistor and a first fuse connected to each other in series between the HIGH enable detection signal and the ground voltage, the PMOS transistor having a gate connected to a second node;

a capacitor having a first terminal connected to the HIGH enable detection signal, and a second terminal connected to a first node that is also connected to a drain of the PMOS transistor and to the first fuse; and an NMOS transistor having a gate connected to the first node, a source connected to the ground voltage, and a drain connected to the second node, wherein a second fuse is connected between the external source voltage and the second node, and wherein an output signal is output from the second node.

* * * * *